US007256460B2

(12) United States Patent
Salling et al.

(10) Patent No.: US 7,256,460 B2
(45) Date of Patent: Aug. 14, 2007

(54) BODY-BIASED PMOS PROTECTION AGAINST ELECTROSTATIC DISCHARGE

(75) Inventors: Craig T. Salling, Cupertino, CA (US); Charvaka Duvvury, Plano, TX (US); Gianluca Boselli, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 63 days.

(21) Appl. No.: 11/001,899

(22) Filed: Nov. 30, 2004

(65) Prior Publication Data

US 2006/0113600 A1    Jun. 1, 2006

(51) Int. Cl.
*H01L 23/62* (2006.01)
(52) U.S. Cl. ............... 257/358; 257/360; 257/363; 257/E29.014
(58) Field of Classification Search ............. 257/173, 257/355–363, E29.014
See application file for complete search history.

(56) References Cited

U.S. PATENT DOCUMENTS

| | | | | |
|---|---|---|---|---|
| 5,686,751 A | * | 11/1997 | Wu | 257/356 |
| 5,744,842 A | * | 4/1998 | Ker | 257/362 |
| 5,874,763 A | * | 2/1999 | Ham | 257/360 |
| 5,940,258 A | | 8/1999 | Duvvury | |
| 5,959,488 A | * | 9/1999 | Lin et al. | 327/313 |
| 2004/0188776 A1 | * | 9/2004 | Russ et al. | 257/401 |
| 2005/0083619 A1 | * | 4/2005 | Steinhoff | 361/56 |

* cited by examiner

*Primary Examiner*—Phat X. Cao
*Assistant Examiner*—Abul Kalam
(74) *Attorney, Agent, or Firm*—W. James Brady; Frederick J. Telecky, Jr.

(57) ABSTRACT

A protection circuit for protecting an integrated circuit pad 201 against an ESD pulse, which comprises a discharge circuit having an elongated MOS transistor 202 (preferably pMOS) in a substrate 205 (preferably n-type), said discharge circuit operable to discharge the ESD pulse to the pad, to ground 203. The embodiment further contains a pump circuit connected to the pad for receiving a portion of the pulse's current; the pump circuit comprises a component 221 determining the size of this current portion (for example, another transistor, a string of forward diodes, or a reverse Zener diode), wherein the component is connected to ground. A discrete resistor 222 (for example about 40 to 60Ω) is connected between the pad and the component and is operable to generate a voltage drop (about 0.5 to 1.0 V) by the current portion. A plurality of contacts to the substrate connects to the resistor so that the voltage drop is uniformly impressed on the substrate to ensure uniform turn-on of the elongated transistor for uniform pulse discharge.

2 Claims, 4 Drawing Sheets

BODY-BIASED PMOS PROTECTION AGAINST ELECTROSTATIC DISCHARGE

FIELD OF THE INVENTION

The present invention is related in general to the field of electronic systems and semiconductor devices and more specifically to structure and method of electrostatic discharge circuits including uniformly activated pMOS protection devices.

DESCRIPTION OF THE RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the "Machine model", MM); it can generate transients with significantly higher rise times and current levels than the HBM ESD source. A third source is described by the "charged device model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events. A solution for uniform turn-on of a multi-finger nMOS transistor, based on a floating guard ring with distributed resistance to ground, has been proposed in U.S. Pat. No. 5,940,258, issued on Aug. 17, 1999 (Duvvury, "Semiconductor ESD Protection Circuit").

The dominant failure mechanism, found in the nMOS protection device operating as a parasitic bipolar transistor in snapback conditions (the bipolar turn-on at snap-back occurs at the collector/drain voltage Vt1 with an associated collector/drain current It1), is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level. The second breakdown trigger current It2 is widely used as an ESD strength monitor.

When the circuit protection is to use multi-finger pMOS transistors, the efficient discharge of an ESD pulse is again based on the formation of parasitic bipolar transistors associated with the pMOS transistors, which require uniform turn-on of all the fingers. As an example, a conventional protection circuit is displayed as a schematic diagram in FIG. 1A and in a schematic cross section in FIG. 1B. In FIG. 1B, the transistor is bordered by shallow trench isolations 120. Source 102b of pMOS transistor 102 is connected to pad (signal, power) 101, and drain 102c is connected to ground (Vss) 103. The circuit of FIGS. 1A and 1B does not ensure uniform trigger of the pMOS transistor in case of an ESD event, since the n-well 114 (through n+ contact region 105) is tied to the pad 101. Furthermore, since gate 102a of the pMOS transistor 102 is tied to source 102b, there is no possibility for an additional regulating well current.

SUMMARY OF THE INVENTION

A need has therefore arisen for cost effective design methods to achieve advanced ESD protection, using especially pMOS transistors, compatible with uniform turn-on, high response speed, low capacitance and low leakage current using standard CMOS processing. An emphasis is to be placed to protect pads locally, and to achieve this protection by using the silicon area needed for the pads in dual ways.

One embodiment of the invention is a protection circuit for protecting an integrated circuit pad against an ESD pulse, which comprises a discharge circuit having an elongated MOS transistor (preferably pMOS) in a substrate (preferably n-type), said discharge circuit operable to discharge the ESD pulse to the pad, to ground. The embodiment further contains a pump circuit connected to the pad for receiving a portion of the pulse's current; the pump circuit comprises a component determining the size of this current portion (for example, another transistor, a string of forward diodes, or a reverse Zener diode), wherein the component is connected to ground. A discrete resistor (about 40 to 60Ω) is connected between the pad and the component and is operable to generate a voltage drop (about 0.5 to 1.0 V) by the current portion. A plurality of contacts to the substrate connects to the resistor so that the voltage drop is uniformly impressed on the substrate to ensure uniform turn-on of the elongated transistor for uniform pulse discharge.

In response to a positive ESD stress at eh pad, the substrate bias turns on the emitter base junction of the parasitic bipolar transistor in the pMOS so that the lateral pnp conducts the ESD current. In addition, an n-diffusion is also connected to pad to form an n+/p-well diode as standard protection against negative ESD stresses.

It is a technical advantage of the present invention that energy for biasing the substrate of the ESD protection circuit is provided by the ESD pulse. This feature eliminates the need to supply an additional voltage source to the ESD protection circuit.

It is another technical advantage that the concept of substrate biasing for uniform discharge transistor triggering can be applied to multifinger transistors.

It is another technical advantage that the protection pMOS transistor can be applied with its gate tied to its source through a series resistor such that CDM protection is built in.

Since the invention employs a discrete resistor, the bias resistor/network generates robust pumping, and is independent of any n-well (or p-well) process changes or variations. The invention thus applies to a wide family of semiconductor processes and devices.

Each pMOS transistor finger has the whole length or at least a large fraction in a high conduction state due to the more uniform potential across the n-well, according to the invention. This stands in contrast to conventional technology with its standard nMOS in an unconfined p-well.

In the invention, the pump current is confined to the n-well and cannot turn on output nMOS transistors, or trigger latch-up in neighboring circuits. Further, the substrate biasing of the ESD protection circuit is provided only during an ESD event. The drawbacks associated with prior substrate biasing schemes are not experienced.

In its most powerful embodiment, the present invention provides a positive clamp and is thus able to protect I/O circuits against worst-case ESD stress (positive with respect to Vss ground).

It is a technical advantage of the present invention that the device structures provide excellent electrical performance, mechanical stability and high reliability. It is further a technical advantage that the fabrication method is simple, yet flexible enough for different semiconductor product families and a wide spectrum of design and process variations. The inventive ESD protection schemes may be implemented using standard semiconductor processing techniques.

The technical advances represented by the invention, as well as the aspects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 1A is a schematic circuit diagram of the protection against ESD stress using a pMOS transistor in an n-well.

FIG. 1B is a schematic cross section of a pMOS transistor in an n-well as used in a circuit for protection against ESD stress.

FIG. 2A is a schematic circuit diagram of the protection against ESD stress using a body-biased pMOS transistor in an n-well having an n-well pump.

FIG. 2B is a schematic cross section of a body-biased pMOS transistor in an n-well having an n-well pump as used in a circuit for protection against ESD stress.

DETAILED DESCRIPTION OF THE PREFERRED EMBODIMENTS

The present invention is related to U.S. Pat. No. 5,940,258, issued on Aug. 17, 1999 (Duvvury, "Semiconductor ESD Protection Circuit").

Figure 1A:
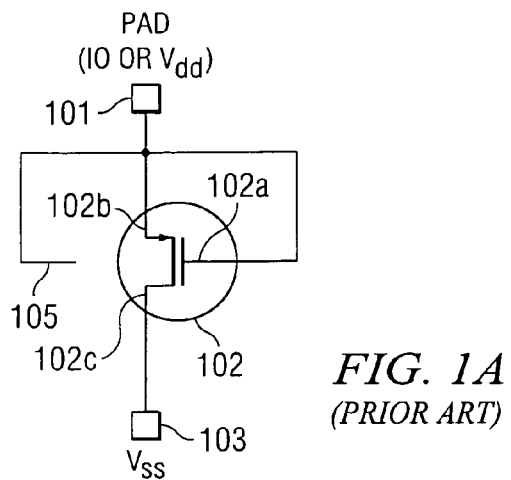
FIGS. 1A and 1B refer to ESD protection circuits of an integrated circuit pad (input/output, power, Vdd) in known technology.
Figure 1B:
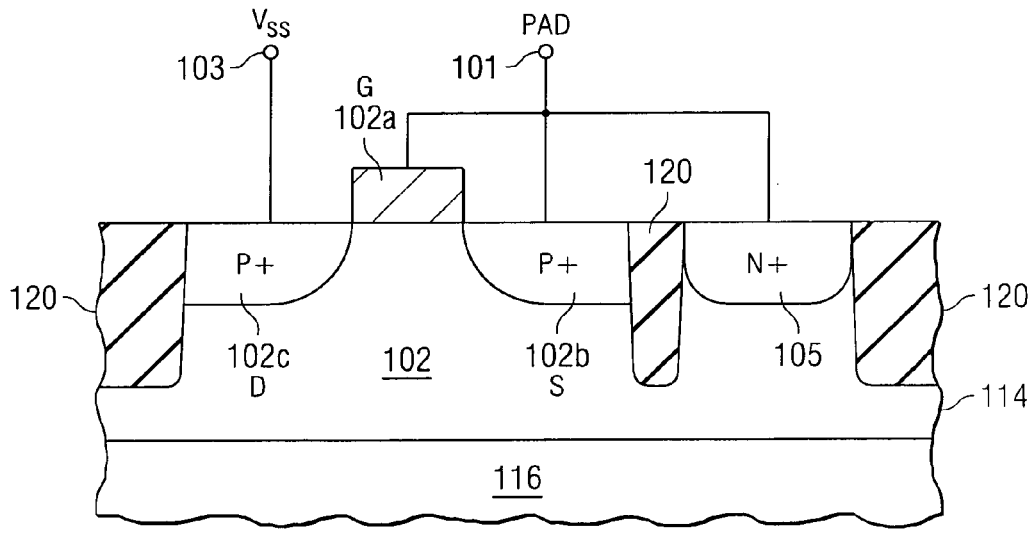
Figure 2A:
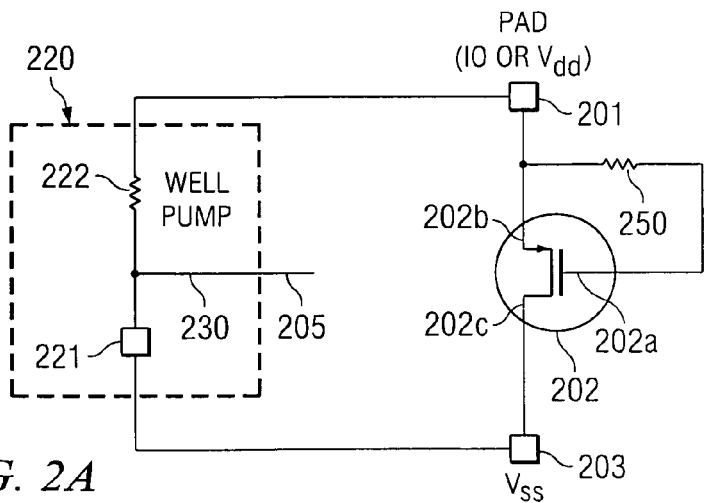
FIGS. 2A and 2B refer to ESD protection circuits of an integrated circuit pad (input/output, power, Vdd) according to an embodiment of the invention.
Figure 2B:
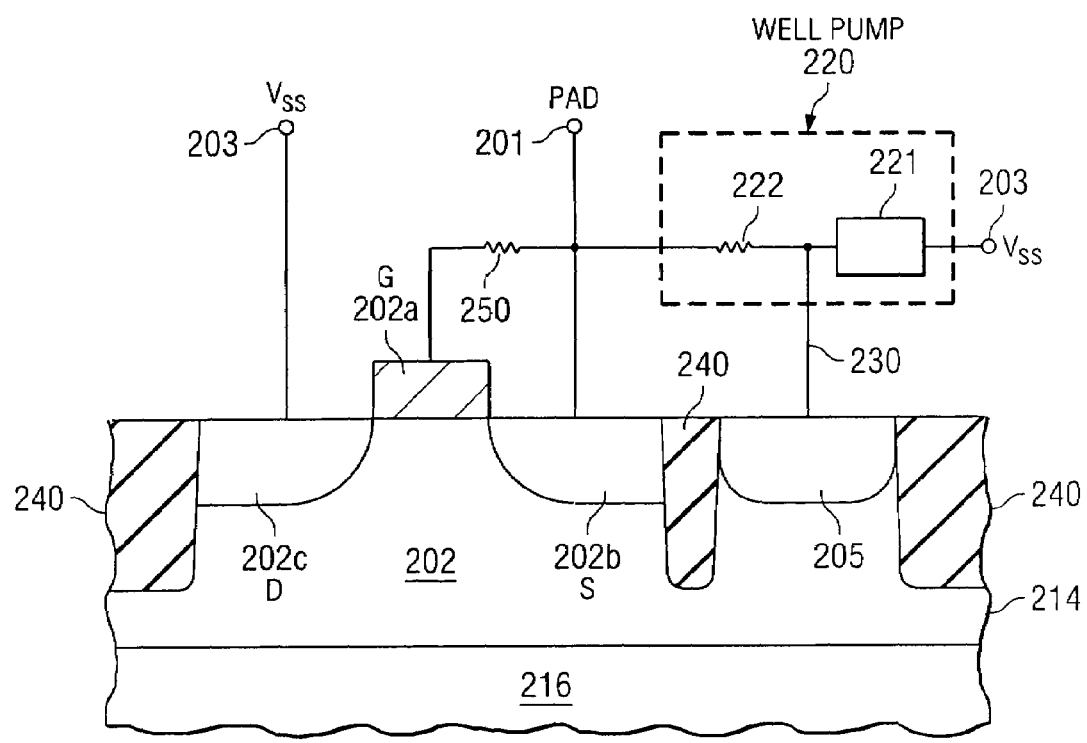

FIGS. 2A and 2B are a schematic circuit diagram and cross section of an ESD protection circuit, which is included in an integrated circuit (IC) in addition to other devices in the IC. These ICs can typically be found in processors, digital and analog devices, and other high performance devices. ESD protection is an integral part of an IC and is typically used at each input/output pin in order to discharge any electrical transients received at the IC before they enter the IC and cause damage to electrostatic sensitive components.

In FIGS. 2A and 2B, 201 represents a pad (input/output, power, Vdd). It is fabricated on the semiconductor substrate 202, usually silicon of a first conductivity type. In the preferred embodiment, the first conductivity type is p-type; it should be stressed, however, that all following considerations also hold for n-type substrates by interchanging the conductivity types. In substrate 202 is a well 214 of the opposite conductivity type with heavily doped contact region 205; in the preferred embodiment, well 214 is n-type and contact region 205 is n+ type; as stated, in other devices well 214 may be p-type having p+ type contacts 205.

The invention comprises a discharge circuit and a pump circuit 220. The discharge circuit is operable to discharge the ESD pulse, which hits pad 201, to ground 203 (Vss). The pump circuit 220 is operable to take advantage of a part I of the same ESD pulse and use it to impress a voltage uniformly into well 214. The discharge circuit comprises an elongated MOS transistor 202, which has a channel of the first conductivity type. In the preferred embodiment, the elongated MOS transistor is a pMOS transistor; furthermore, it is preferably of a multi-finger design. In FIG. 2B, the transistor is bordered by shallow trench isolations 240. Source 202b of transistor 202 is connected to pad (I/O, power, Vdd) 201, and drain 202c is connected to ground (Vss) 203. Gate 202a of transistor 202 is tied to source 202b through gate resistor 250. This resistor 250 is selected so that gate 202a is protected under transient pulses such as the charged device model CDM. For example, for a selected oxide capacitance $C_{oxide}$, gate resistor 250 ($R_{gate}$) may be designed such that $$R_{gate} \cdot C_{oxide} > 2E-10/(W \cdot L),$$

where W=width of transistor 202 (μm),

L=length of transistor 202 (μm), $R_{gate}$ is measured in Ω, and $C_{oxide}$ is measured in F.

When uniform turn-on of the pMOS transistor is assured by effective well-pumping of the pump circuit 220, the pMOS can be used as a positive clamp. It is thus feasible to protect the pad 201 against the worst-case stress, which is positive with respect to Vss.

The pump circuit 220 has an input for receiving a portion I of the ESD pulse's current. It is convenient to let pad 201 be the input. If the large voltage change dV/dt of the ESD pulse at pad 201 is to be utilized, the current flow I can be provided through a capacitor C (not shown in FIGS. 2A and 2B) by the relation $$I = C \cdot dV/dt.$$

The pump circuit further comprises a component 221, which determines the size of the current portion I and is connected to ground 203. The embodiments described below give examples of components; they include an MOS transistor with a channel of a conductivity type opposite to the conductivity of discharge transistor 202; a string of forward diodes; and a reverse Zener diode.

Furthermore, the pump circuit 220 includes a discrete resistor 222, which is connected between pad 201 and component 221. This resistor 222 has size R and is operable to generate a voltage drop by current portion I given by the relation $$V = I \cdot R.$$

If V is intended to be about 0.5 to 1.0 V, R is preferably between about 40 to 60Ω.

Pump circuit 220 also contains a plurality of contacts 230 to contacts 205 of well 214. These contacts 230 are connected to resistor 222 so that voltage drop V is uniformly impressed on substrate 214 in order to ensure uniform turn-on of the elongated (multi-finger) MOS transistor 202 for a uniform discharge of the ESD pulse. There is no latch-up problem if well 214 is still at the same potential as pad 201 during normal operation.

Figure 3:
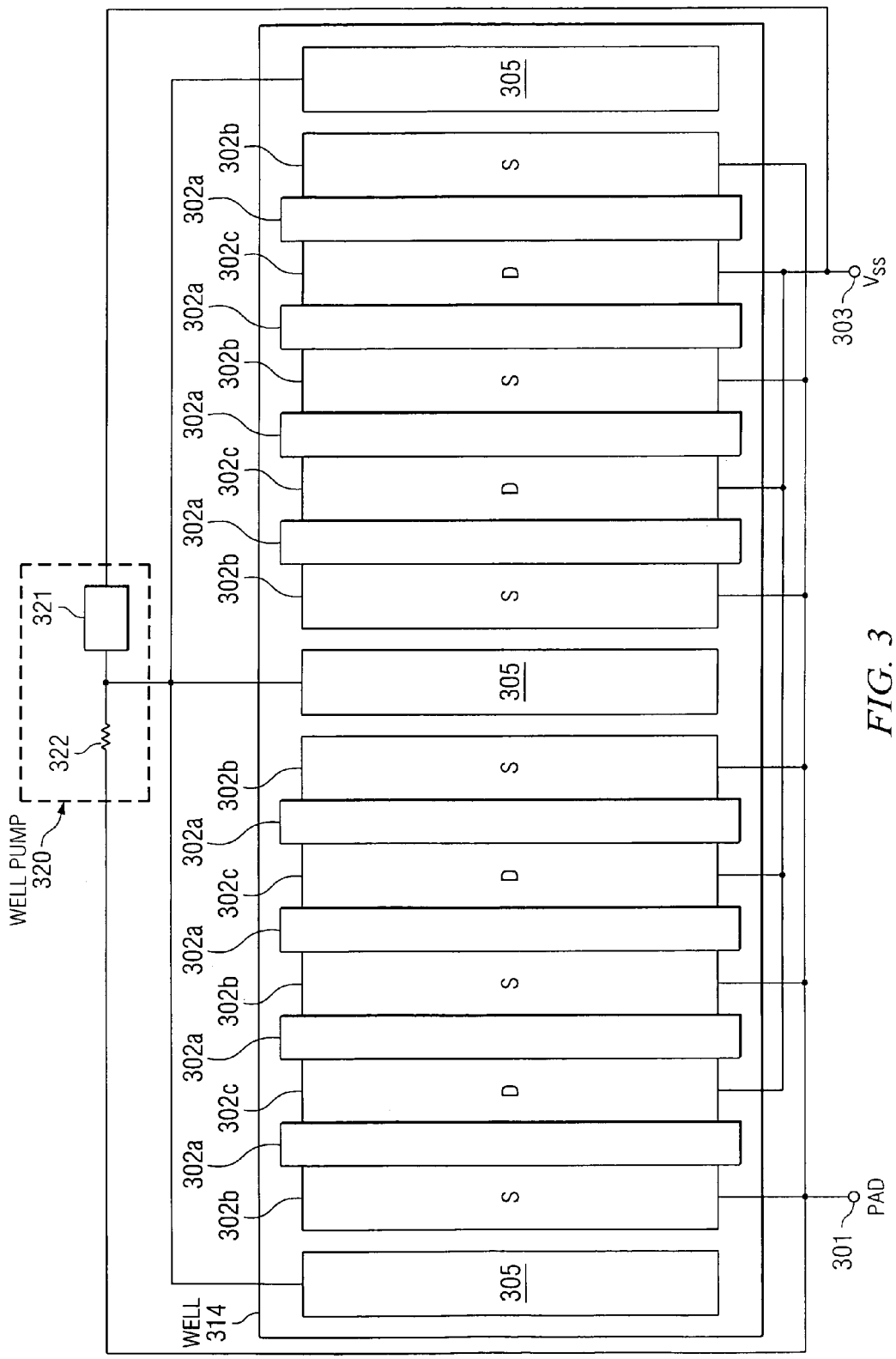
FIG. 3 is a schematic top view of a multifinger pMOS transistor in an n-well having an n-well pump as used in a circuit for protection against ESD stress according to an embodiment of the invention.

FIG. 3 illustrates an embodiment with the preferred multi-finger discharge transistor, shown in schematic top view. Pad 301 corresponds to pad 201 in FIG. 2, and ground (Vss) 303 to ground (Vss) 203 in FIG. 2. Again, the preferred embodiment is a pMOS transistor in an n-well, but the opposite conductivities are also within the scope of the invention. The heavily doped source fingers 302b of the transistor are connected to pad 301, and the heavily doped drain fingers 302c are connected to ground (Vss) 303. The connections of the multi-gate 302a to the multi-source of the transistor are not shown in FIG. 3. Notice that the heavily doped multi-contacts 305 to well 314 are connected to the well pump 320.

Located within well pump 320 is resistor 322, which is connected to pad 301 and to well contacts 305, and component 321, which is connected to ground 303 and to well multi-contacts 305. The fact that a plurality of contacts 305 are provided from resistor 322 to well 314 ensures that the voltage drop of the ESD pulse portion along resistor 322 is uniformly impressed on well 314. This uniformity, in turn, ensures uniform turn-on of the elongated fingers of the transistor and thus a uniform discharge of the ESD pulse.

Figure 4:
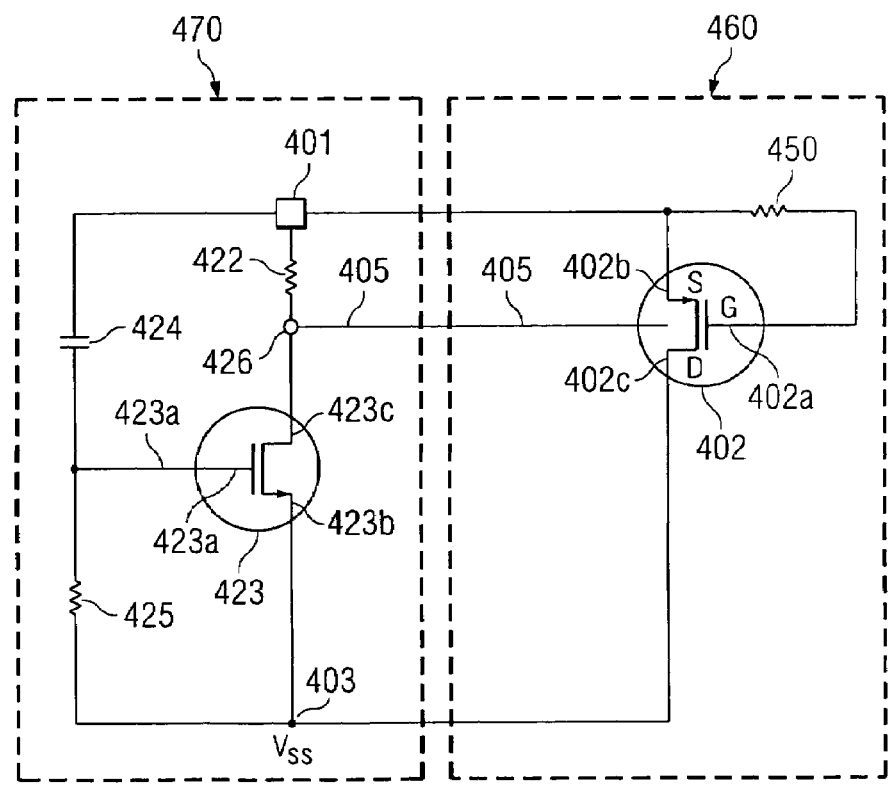
FIG. 4 is a schematic circuit diagram illustrating another embodiment of the invention, featuring an MOS transistor with substrate pumped by a biasing transistor.

Another embodiment for a protection circuit on a semiconductor substrate of a first conductivity type for protecting an IC pad 401 against an ESD pulse is illustrated in FIG. 4. Embedded in the substrate is a well of the opposite conductivity type with heavily doped contact regions 405. The protection circuit comprises a discharge circuit 460, located in the well, and a pump circuit 470, located in the substrate.

The discharge circuit 460 is operable to discharge the ESD pulse, which hits pad 401, to ground 403 (Vss). The pump circuit 470 is operable to take advantage of a part of the same ESD pulse and use it to impress a voltage uniformly into the well. The discharge circuit comprises a first, elongated MOS transistor 402, preferably a multi-finger transistor, which has a channel (or channels) of the first conductivity type. In the preferred embodiment, the first elongated MOS transistor is a pMOS transistor. Source 402b of transistor 402 is connected to pad 401, and drain 402c is connected to ground (Vss) 403. Gate 402a of transistor 402 is tied to source 402b through gate resistor 450. This resistor 450 is selected so that gate 402a is protected under transient pulses such as the CDM.

Pump circuit 470 has a second MOS transistor 423, which determines the size of the current portion. Second MOS transistor 423 has a channel of the opposite conductivity type; consequently, when first MOS transistor 402 is pMOS, then second MOS transistor 423 is nMOS. Source 423b of transistor 423 is connected to ground 403. Typically, transistor 423 may be about 10 µm wide.

A first discrete resistor 422 is connected between pad 401 and drain 423c of transistor 423. It is this discrete resistor 422, which is operable to generate a voltage drop by the current portion from the pulse at pad 401. As an example, when the voltage drop is intended to be about 0.5 to 1.0 V, resistance 422 is preferably between about 40 to 60Ω.

With an ESD pulse at pad 401, capacitor 424 and second resistor 425, in series with each other, in parallel to transistor 423 and connected to gate 423a, determine the turn-on of transistor 423. The current through transistor 423 and first discrete resistor 422 determine the bias at node 426 to well contacts 405. Typically, capacitor 424 is between about 100 fF and 1 pF, and second resistor 425 is between about 1 kΩ and 10 kΩ.

In actual device designs, all four components (resistor 422, transistor 423, capacitor 424, and resistor 425) can be adjusted in any manner to give a bias at node 426 between 0.5 and 1.0 V. Furthermore, capacitor 424 and resistor 425 are adjusted so that for circuit operation, node 426 is at the same potential as pad 401.

A positive ESD clamp with a pMOS transistor 402 in a pumped n-well as described above provides the following advantages compared to the conventional substrate-pumped nMOS transistor in a p-well: The pumping set by the first resistor 422 and the coordinated network of second transistor 423, capacitor 424, and second resistor 425, is robust and independent of process changes or variations for the p-substrate and n-well. A larger fraction of each pMOS finger is in a high conduction state due to more uniform potential across the n-well within the p-substrate, as compared to the condition across the un-confined p-well of an nMOS transistor. The pump current is confined to the n-well and cannot turn on output nMOS transistors or trigger latch-up in neighboring circuits.

Figure 5:
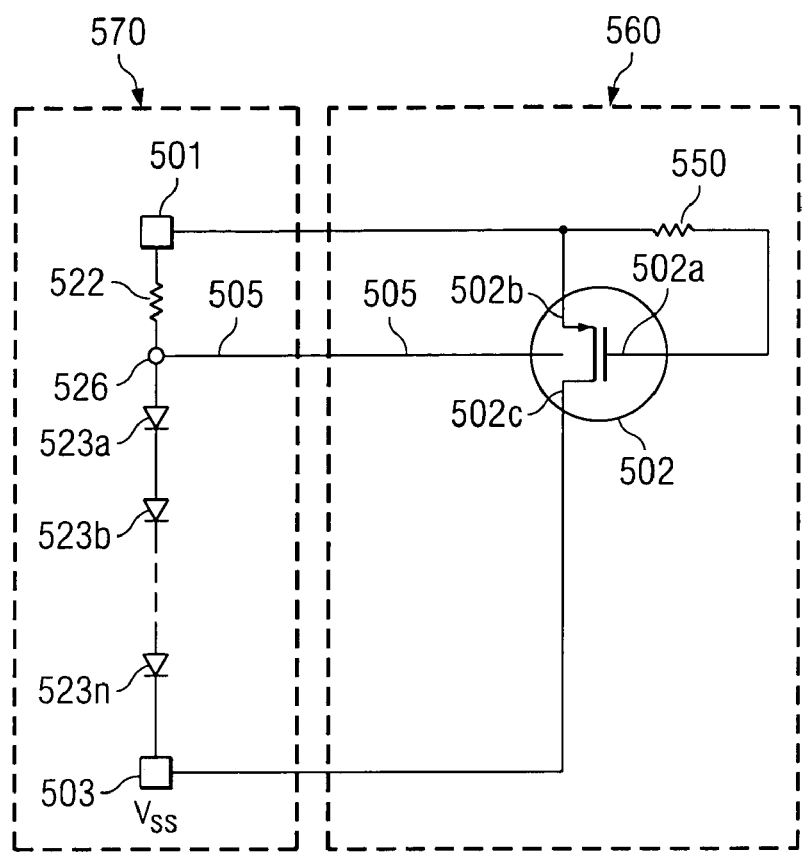
FIG. 5 is a schematic circuit diagram illustrating another embodiment of the invention, featuring an MOS transistor with substrate pumped by a string of forward diodes.

Another embodiment for a protection circuit on a semiconductor substrate of a first conductivity type for protecting an IC pad 501 against an ESD pulse is illustrated in FIG. 5. Embedded in the substrate is a well of the opposite conductivity type with heavily doped contact regions 505. The protection circuit comprises a discharge circuit 560, located in the well, and a pump circuit 570, located in the substrate.

The discharge circuit 560 is operable to discharge the ESD pulse, which hits pad 501, to ground 503 (Vss). The pump circuit 570 is operable to take advantage of a part of the same ESD pulse and use it to impress a voltage uniformly into the well. The discharge circuit comprises an elongated MOS transistor 502, preferably a multi-finger transistor, which has a channel (or channels) of the first conductivity type. In the preferred embodiment, the elongated MOS transistor is a pMOS transistor. Source 502b of transistor 502 is connected to pad 501, and drain 502c is connected to ground (Vss) 503. Gate 502a of transistor 502 is tied to source 502b through gate resistor 550. This resistor 550 is selected so that gate 502a is protected under transient pulses such as the CDM.

Pump circuit 570 has a plurality of forward diodes 523a through 523n in series connected between pad 501 and ground 503. The total number n of diodes is chosen such that the leakage specification at pad 501 is met for normal operation. For example, for a 3.3 V I/O or Vdd, the number n could be 7, or for a 1.2 V operation, the number n could be 4.

A discrete resistor 522 is connected between pad 501 and the anode of the diode 523a of the plurality. It is this discrete resistor 522, which is operable to generate, together with the plurality of diodes 523a through 523n in series, a voltage drop by the current portion from the pulse at pad 501. As an example, when the voltage drop at node 526 is intended to be about 0.5 to 1.0 V, resistance 522 is preferably between about 40 to 60Ω. During circuit operation, the diodes conduct very little current and hence node 526 is essentially at the same potential as pad 501.

With an ESD pulse at pad 501, the current through the diode plurality 523a to 523n and discrete resistor 522 determine the bias at node 526 to well contacts 505 of the protection transistor 502. In actual device designs, the two components (resistor 522, and n diodes 523a to 523n) can be adjusted in any manner to give a bias at node 526 between 0.5 and 1.0 V.

Figure 6:
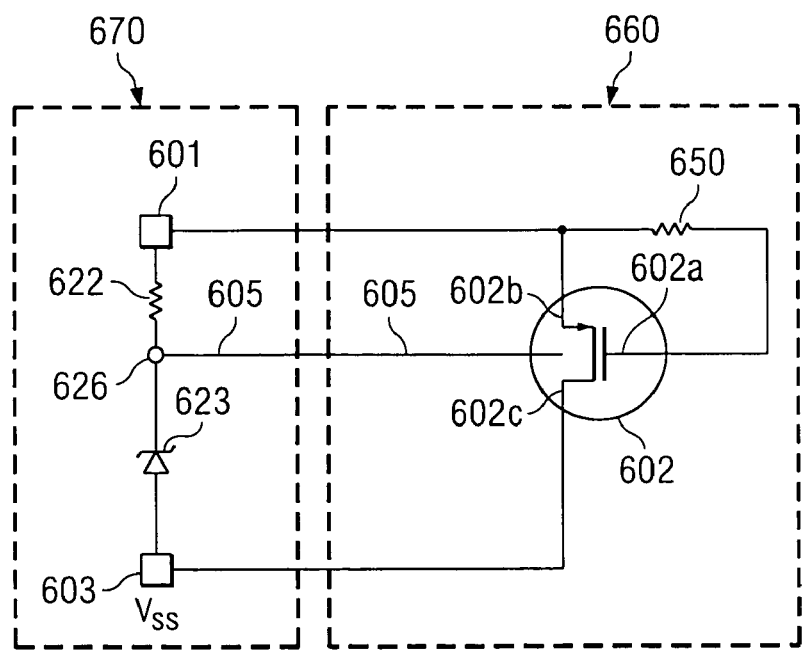
FIG. 6 is a schematic circuit diagram illustrating another embodiment of the invention, featuring an MOS transistor with substrate pumped by a reverse Zener diode.

Another embodiment for a protection circuit on a semiconductor substrate of a first conductivity type for protecting an IC pad 601 against an ESD pulse is illustrated in FIG. 6. Embedded in the substrate is a well of the opposite conductivity type with heavily doped contact regions 605. The protection circuit comprises a discharge circuit 660, located in the well, and a pump circuit 670, located in the substrate.

The discharge circuit 660 is operable to discharge the ESD pulse, which hits pad 601, to ground 603 (Vss). The pump circuit 670 is operable to take advantage of a part of the same ESD pulse and use it to impress a voltage uniformly into the well. The discharge circuit comprises an elongated MOS transistor 602, preferably a multi-finger transistor, which has a channel (or channels) of the first conductivity type. In the preferred embodiment, the elongated MOS transistor is a pMOS transistor. Source 602b of transistor 602 is connected to pad 601, and drain 602c is connected to ground (Vss) 603. Gate 602a of transistor 602 is tied to source 602b through gate resistor 650. This resistor 650 is selected so that gate 602a is protected under transient pulses such as the CDM.

Pump circuit 670 has a reverse Zener diode 623 connected between pad 601 and ground 603. In series with Zener diode 623 is discrete resistor 622. Zener diode 623 can be placed such that under an ESD pulse, its avalanche breakdown would draw current through resistor 622 to determine the well bias at node 626 between about 0.5 and 1.0 V. The value of discrete resistor 622 is thus selected such that the current trough it after Zener breakdown provides the desired bias at node 626. An example for the preferred range, resistor 622 may be between about 40 and 60Ω. The Zener avalanche breakdown value is selected such (for instance, between about 5 and 6 V) that its breakdown is above circuit operation voltage and there is no trigger for normal conditions. During normal circuit operation, the Zener diode does not conduct current and hence node 626 is essentially at the same potential as pad 601.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in pMOS transistors in an n-well as well as in nMOS transistors in a p-well to create ESD protection. As another example, the substrate material may include silicon, silicon germanium, gallium arsenide and other semiconductor materials employed in manufacturing. As yet another example, the concept of the invention is effective for many semiconductor device technology nodes and not restricted to a particular one. It is therefore intended that the appended claims encompass any such modifications or embodiments.

We claim:

1. A protection circuit for protecting an integrated circuit pad against an ESD pulse, comprising:
   a discharge circuit including an elongated multifinger a p-type metal-oxide-semiconductor (PMOS) transistor formed on a substrate having a gate connected to said integrated circuit pad, said discharge circuit operable to discharge said ESD pulse to ground;
   a pump circuit comprising:
      an input for receiving a current portion of said ESD pulse;
      an n-type metal-oxide-semiconductor (NMOS) transistor for determining the size of said current portion, said NMOS transistor having its source connected to ground and its gate capacitively coupled to said integrated circuit pad;
      a discrete resistor connected between said input and said NMOS transistor, said resistor operable to generate a voltage drop corresponding to said current portion; and
   a plurality of contacts to said substrate connected to said resistor so that said voltage drop is uniformly impressed on said substrate to provide a substrate bias, wherein the substrate bias ensures uniform turn on of said elongated transistor for uniform pulse discharge.

2. The protection circuit according to claim 1 wherein said substrate bias is between about 0.5 and 1.0 V.

* * * * *